United States Patent [19]

Nakano et al.

[11] Patent Number: 5,309,040
[45] Date of Patent: May 3, 1994

[54] VOLTAGE REDUCING CIRCUIT

[75] Inventors: Tomio Nakano, Tajimi; Yoshiharu Kato; Hidenori Nomura, both of Kasugai, all of Japan

[73] Assignees: Fujitsu Limited, Kawasaki; Fujitsu VLSI Limited, Kasugai, both of Japan

[21] Appl. No.: 73,308

[22] Filed: Jun. 8, 1993

Related U.S. Application Data

[63] Continuation of Ser. No. 957,055, Oct. 6, 1992, abandoned, which is a continuation of Ser. No. 721,433, Jul. 5, 1991, abandoned.

[30] Foreign Application Priority Data

Nov. 7, 1989 [JP] Japan .................. 1-289118

[51] Int. Cl.⁵ .......... H03K 3/01; G05F 3/16; G05B 24/02
[52] U.S. Cl. .................. 307/303.2; 307/296.4; 307/296.8; 323/313; 323/315; 323/353
[58] Field of Search .............. 307/303, 303.1–303.2, 307/296.4, 296.1, 296.8, 264; 323/312–313, 315, 353

[56] References Cited

U.S. PATENT DOCUMENTS

| | | | |
|---|---|---|---|
| 4,806,789 | 2/1989 | Sakihama et al. | 307/494 |
| 4,812,735 | 3/1989 | Sawada et al. | 323/313 |
| 4,978,904 | 12/1990 | Fitzpatrick et al. | 323/313 |
| 5,001,362 | 3/1991 | Tran | 307/362 |
| 5,079,441 | 1/1992 | Scott | 323/312 |

FOREIGN PATENT DOCUMENTS

| | | |
|---|---|---|
| 54-23340 | 2/1979 | Japan . |
| 55-156354 | 12/1980 | Japan . |
| 59-110209 | 6/1984 | Japan . |
| 59-112640 | 6/1984 | Japan . |

OTHER PUBLICATIONS

IBM Tech. Disc. Bul. "Switchable High-Voltage Supply" Greerson et al. vol. 11, No. 11 Apr. 1969.
T. Furuyama et al, "A New On-chip Voltage Converter for Submicrometer High-Density DRAM's", IEEE Journal of Solid-State Circuits, vol. 22, No. 3, Jun. 1987, pp. 437–441.
Patent Abstracts of Japan, vol. 012, No. 043 (P-664) Feb. 9, 1988, abstract.
Supplementary European Search Report.

*Primary Examiner*—Margaret Rose Wambach
*Attorney, Agent, or Firm*—Armstrong, Westerman, Hattori, McLeland & Naughton

[57] ABSTRACT

In a semiconductor integrated circuit for taking in an external power source voltage from outside the semiconductor chip, the external power source voltage is dropped by a voltage dropping unit installed inside the semiconductor chip and the external power source voltage in the semiconductor integrated circuit, as dropped is supplied as an internal power source voltage to the semiconductor chip and used as the internal power source voltage, a plurality of voltage dropping units are installed for each of a plurality of semiconductor circuit block installed inside the semiconductor chip, and the voltage fluctuation of an internal power source is effectively suppressed in the event that a circuit consuming a very high current is operated.

8 Claims, 10 Drawing Sheets

VOLTAGE REDUCING CIRCUIT

This application is a continuation of application Ser. No. 07/957,055 filed Oct. 6, 1992, now abandoned, which in turn is a continuation of application Ser. No. 07/721,433 filed Jul. 5, 1991, now abandoned.

BACKGROUND OF THE INVENTION

1. Field of the Invention

The present invention relates to a semiconductor integrated circuit, and more particularly, relates to a semiconductor integrated circuit for dropping an external power source voltage to thereby obtain an internal power source voltage 2. Description of the Relevant Art In general, it is preferable that miniaturization of semiconductor elements continue so that the integration level of semiconductor integrated circuits can be enhanced. However, the further miniaturization of semiconductor elements leads to such disadvantages as a lowering of the pressure resistance thereof and the possibility that the element will be adversely influenced by hot electrons.

As an effective countermeasure against these inconveniences, is the lowering of the power source voltage to be supplied to the semiconductor element so as to minimize the electric field strength of the respective portions of the element. For example, the destruction by aging of an oxidated film can be prevented by lowering the electric field strength of the oxidated film. Further, by lowering the channel electric field strength, the generation of hot electrons can be suppressed to thereby reduce the amount of hot electrons injected into the oxidated film, i.e., the hot electron instability (concretely, the variation of threshold value $V_{th}$ and a poor conductance) can be prevented.

Figure 1:
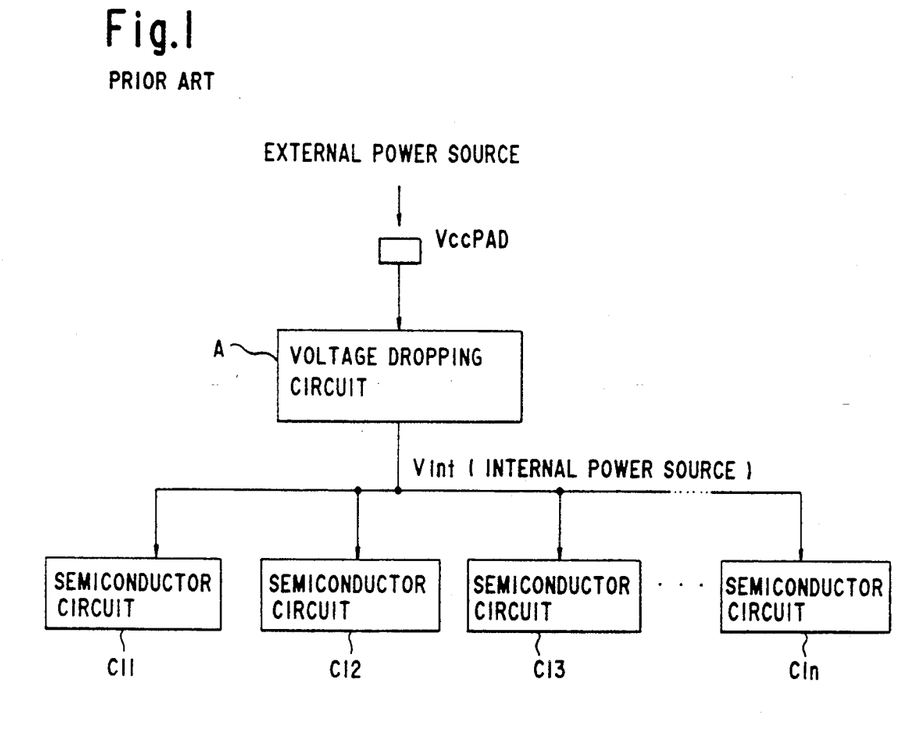
FIG. 1 is a block circuit diagram showing the structure of a conventional semiconductor integrated circuit for dropping an external power source voltage to form a low voltage internal power source.
Figure 2:
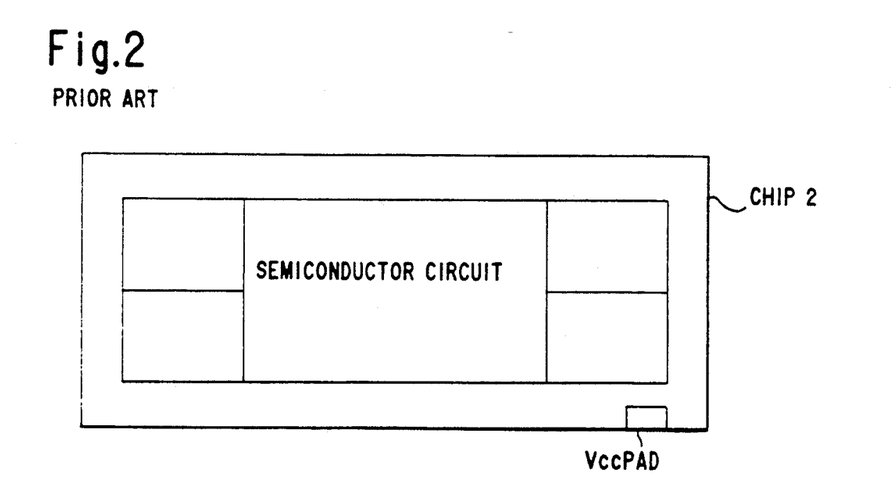
FIG. 2 is an layout drawing of a plurality of semiconductor circuit chips provided on a semiconductor integrated circuit.

Many of the problems arising in miniaturized elements can be solved if the power source voltage is thus lowered, but it is not preferable for the preparation of an exclusive-use external power source because the system becomes complex and dedicated power source wires are required. Therefore, the method of dropping the external power source voltage inside a semiconductor integrated circuit to thus form a low voltage internal power source is generally adopted. FIG. 1 and FIG. 2 show the structure of a conventional semiconductor integrated circuit for dropping the external power source voltage inside the semiconductor integrated circuit in order to produce a low voltage internal power source. In FIG. 1, VccPAD is a power source terminal installed at a semiconductor chip, to which the external power source is to be applied, "A" is a voltage drop circuit, and C11 through C1n represent a plurality ("n" units) of semiconductor circuits The power source terminal VccPAD is installed, usually as one body, on the semiconductor chip 2, and the semiconductor circuits C11 through C1n are two-dimensionally arranged in the plane of the semiconductor chip 2. The voltage drop circuit "A" forms an internal power source voltage Vint, which drops the external power source voltage applied to the power source terminal VccPAD, to a given voltage. This external voltage is a common power source voltage which is also applied to the other semiconductor integrated circuits and is, for example, +5 V. The voltage is dropped to a given level by utilizing, for example, the channel resistance of a MOS transistor.

The given voltage referred to herein means the voltage necessary for the actuation of a miniaturized semiconductor element (for example, a MOS transistor) forming a structure of a plurality of internal semiconductor circuits C11 through C1n, and moreover, which effectively avoids a pressure resistance and hot electrons.

Figure 3:
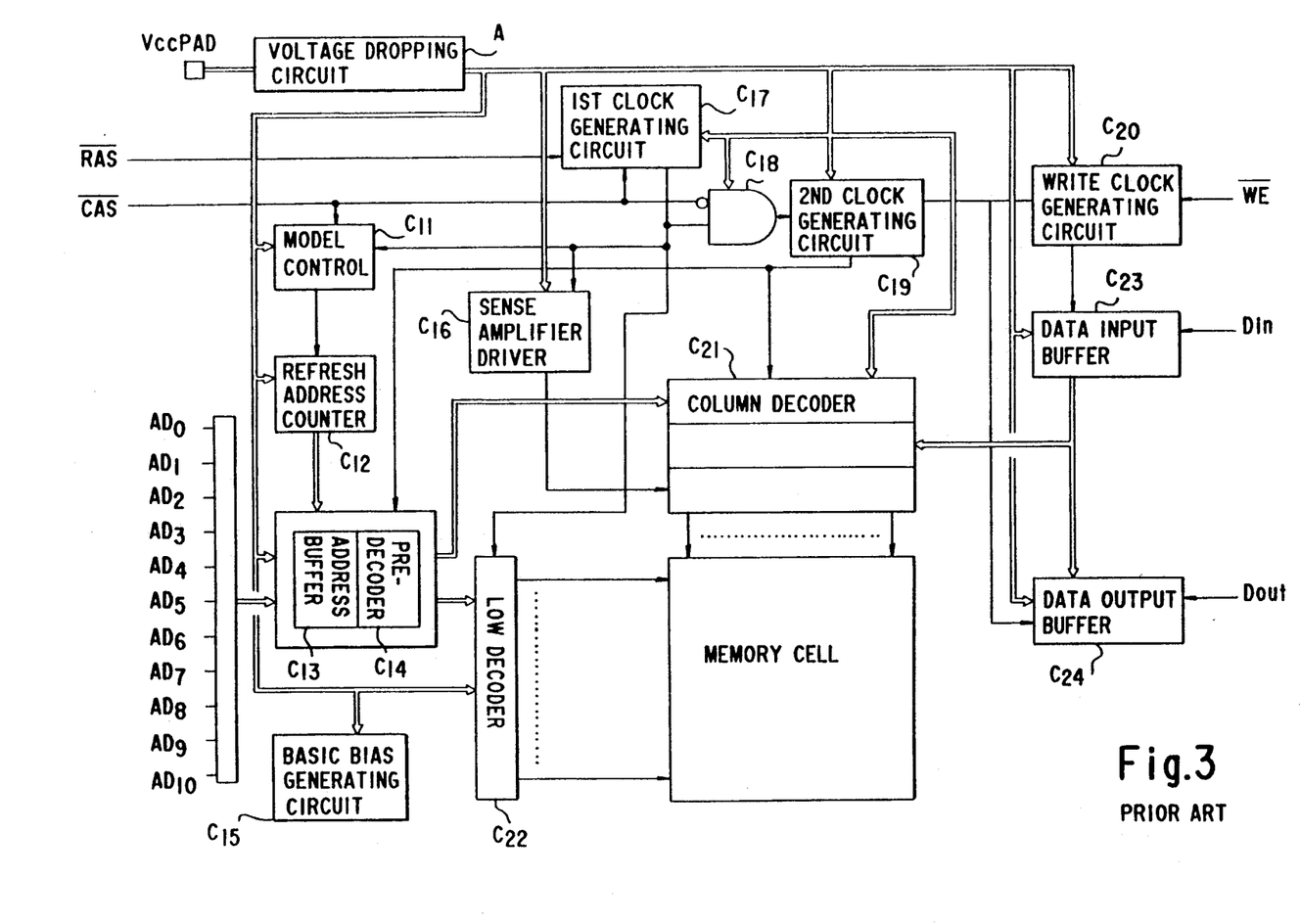
FIG. 3 is a block circuit diagram showing a concrete structural example of a plurality of semiconductor circuits.
Figure 4A:
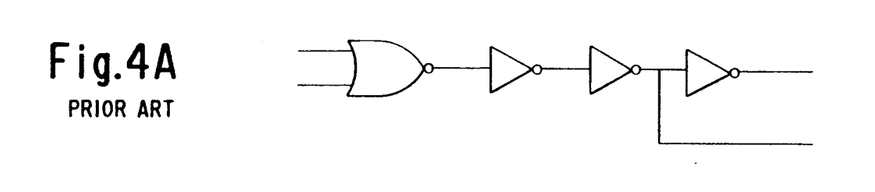
FIG. 4A is a circuit diagram showing a structural example of the address buffer of FIG. 3.
Figures 4B, 5:
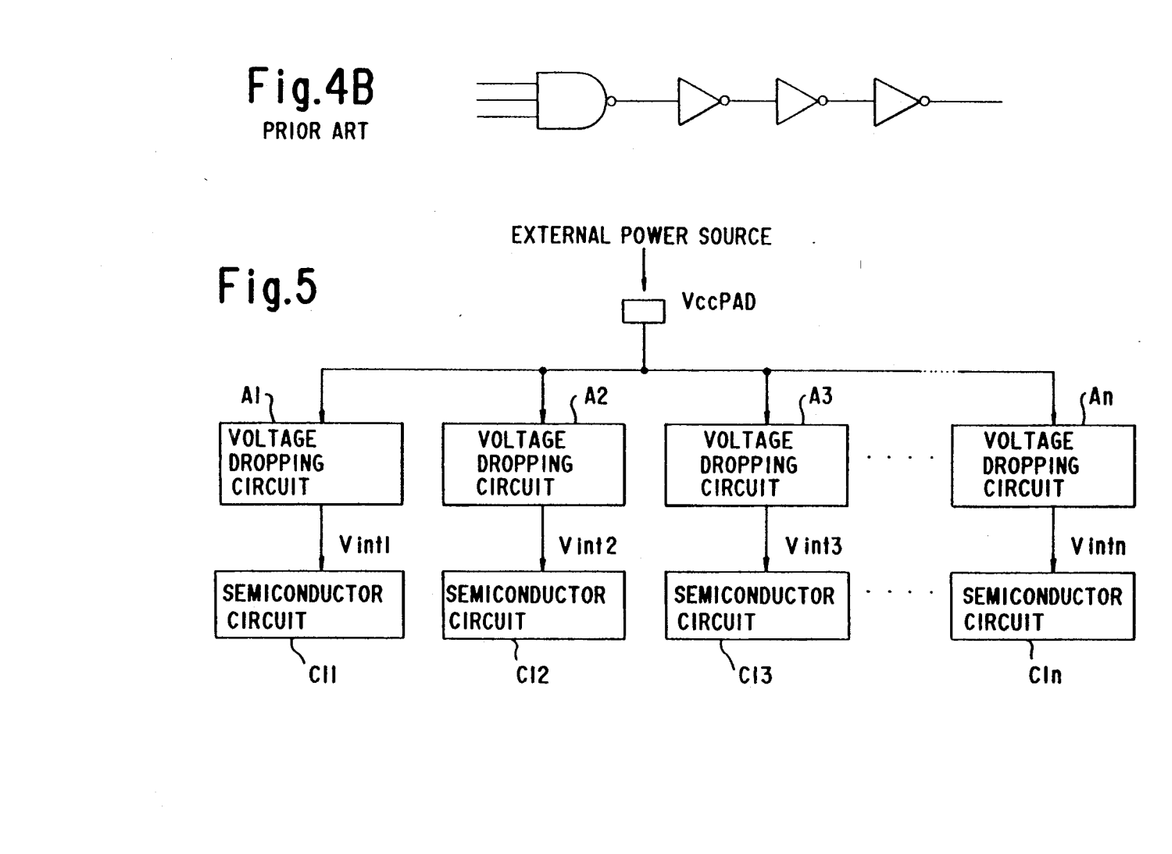
FIG. 4B is a circuit diagram showing a structural example of the pre-decoder of FIG. 3.
FIG. 5 is a block circuit diagram showing the structure of a semiconductor integrated circuit in accordance with the present invention for dropping the external power source voltage to thus generate a low voltage internal power source.

FIG. 3 shows an example of semiconductor circuits C11 through C1n given in FIG. 1, wherein the semiconductor integrated circuit is a dynamic RAM. In this FIGURE, $C_{11}$ is a mode control circuit, $C_{12}$ a refresh address counter, $C_{13}$ an address buffer, $C_{14}$ a pre-decoder, $C_{15}$ a basic bias generating circuit, $C_{16}$ a sense amplifier driver, $C_{17}$ a first clock generating circuit, $C_{18}$ a gate circuit, $C_{19}$ a second clock generating circuit, $C_{20}$ a write clock generating circuit, $C_{21}$ a column decoder, $C_{22}$ a low decoder, $C_{23}$ a date input buffer and $C_{24}$ a data output buffer, and the internal power source voltage, which has been dropped by the voltage drop circuit "A," can be supplied to each of these semiconductor circuits C11 through C24. FIG. 4A is a circuit diagram showing the structure example of the address buffer of FIG. 3, whereas FIG. 4B is a circuit diagram showing the structure example of the pre-decoder of FIG. 3.

In this type of conventional semiconductor integrated circuit, however, because a plurality of internal semiconductor integrated circuits (C11 through C1n in FIG. 1, and $C_{11}$ through $C_{1n}$ in FIG. 3) use a single internal power source voltage Vint in common there is a danger that the potential of Vint will instantaneously drop, and thus the other semiconductor circuits may malfunction because of this; for example, when a semiconductor circuit consuming a very large current is actuated outside of these internal semiconductor circuits (C11 through C1n in FIG. 1 and $C_{11}$ through $C_{1n}$ in FIG. 3).

Therefore, a technique is employed such as the installation of a circuit to detect the voltage drop of the internal power source voltage Vint, and supplying a comparatively large current when the voltage drop has been detected, thus suppress the fluctuations of internal power source voltage. In this method, however, a delay in the response, to a certain degree, was unavoidable until the current was supplied after the actual voltage drop, and as a result, the conventional circuit could not properly or effectively suppress the instantaneous voltage drop of the internal power source voltage Vint.

SUMMARY OF THE INVENTION

Therefore, an object of this invention is to provide a semiconductor integrated circuit capable of effectively suppressing voltage fluctuations in an internal power source voltage, and preventing a malfunction of the semiconductor circuits even if a semiconductor circuit consuming a large current is actuated.

In a semiconductor integrated circuit, the external power source voltage existing outside the semiconductor chip is taken therein via the external power source terminal, and this external power source voltage is dropped by a voltage dropping means installed inside the semiconductor chip which, as an internal power source voltage, is supplied to the inside of the semiconductor chip. In order to achieve the object of the prevent invention, an external power source terminal is connected to the inside of the semiconductor chip; a plurality of voltage dropping means are installed for altering the external power source voltage into a desired internal power source voltage; and at least 1 block of a plurality of semiconductor circuit blocks arranged inside the semiconductor chip are connected to each of the voltage dropping means.

As a result, in this invention, an exclusive-use internal power source voltage is formed for each of several semiconductor circuits, and the influence of other internal power source voltages can be avoided if a fluctuation of a single internal power source voltage should occur.

These and other features of the invention will be understood upon reading of the following description along with the drawings.

DESCRIPTION OF THE PREFERRED EMBODIMENTS

The present inventions is now explained with reference to the drawings.

FIG. 5 is a block circuit diagram showing the structure of semiconductor integrated circuit related to the present invention. In FIG. 5, VccPAD indicates a power source terminal for an external power source, A1 through An are voltage dropping circuits, and C11 through C1n are semiconductor circuit blocks, respectively. The voltage dropping circuits A1 through An are installed for each of a plurality of semiconductor internal circuits (semiconductor circuit blocks) C11 through C1n, and are for dropping the external power source voltage Vcc applied to the power source terminal VccPAD to a given voltage by utilizing, for example, the channel resistance of a MOS transistor so as to form the internal power source voltages from Vint1 through Vintn, respectively.

Figure 6:
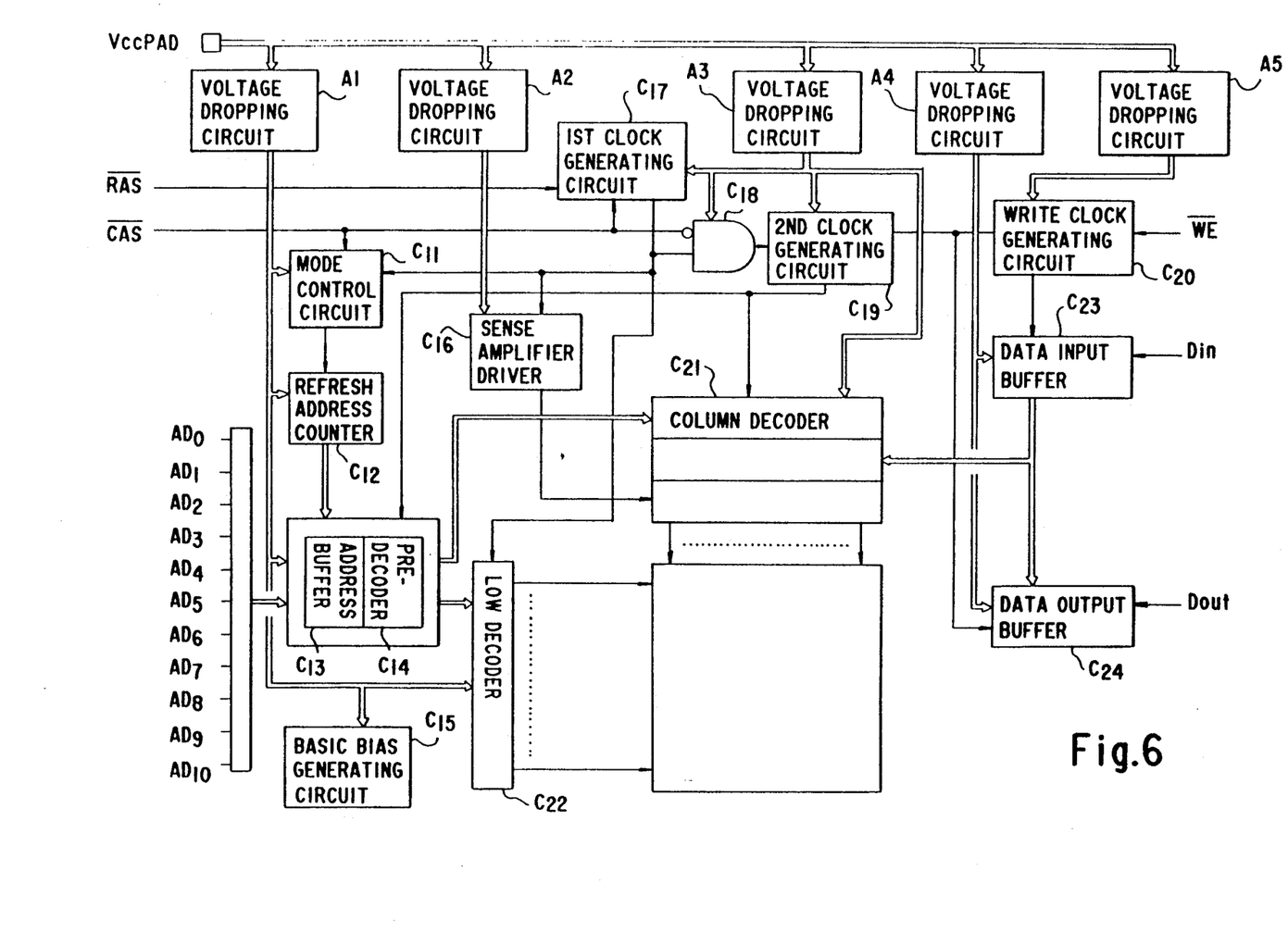
FIG. 6 is a block circuit diagram showing a concrete structural example of a plurality of semiconductor circuits shown in FIG. 5.

Here, a plurality of semiconductor circuit blocks C11 through C1n are respective functional blocks formed on the semiconductor integrated circuit. For example, in the case of a dynamic RAM (DRAM), such functional blocks as a clock generator and memory cell array (including the sense amplifier) are semiconductor circuit blocks. FIG. 6 shows concrete circuit examples of semiconductor circuits C11 through C1n when the semiconductor integrated circuits are DRAMs, and the same reference symbols are used for identical elements of the conventional semiconductor integrated circuit shown in FIG. 3. In FIG. 6, $C_{11}$ is a mode control circuit, $C_{12}$ a refresh address counter, $C_{13}$ an address buffer, $C_{14}$ a pre-decoder, $C_{15}$ a basic bias generating circuit, $C_{16}$ a sense amplifier driver, $C_{17}$ a 1st clock generating circuit, $C_{18}$ a gate circuit, $C_{19}$ a 2nd clock generating circuit, $C_{20}$ a write clock generating circuit, $C_{21}$ a column decoder, $C_{22}$ a low decoder, $C_{23}$ a data input buffer and $C_{24}$ a data output buffer, respectively, and the internal power source voltage which has been dropped by the voltage dropping circuits A1 through A5 is to be supplied to each of these semiconductor circuits $C_{11}$ through $C_{24}$. The address buffer $C_{13}$ and the pre-decoder $C_{14}$ have the same structures as those shown in FIG. 4A and FIG. 4B.

In this embodiment, the mode control circuit $C_{11}$, refresh address counter $C_{12}$, address buffer $C_{13}$, pre-decoder $C_{14}$, basic bias generating circuit $C_{15}$ and low decoder $C_{22}$ corresponds to the semiconductor circuit C11 of FIG. 5, and are activated by the internal power source voltage Vint1 from the voltage dropping circuit A1. Further, the sense amplifier driver $C_{16}$ corresponds to the semiconductor circuit C12 of FIG. 5 and is activated by the internal power source voltage Vint2 from the voltage dropping circuit A2. Furthermore, the 1st clock generating circuit $C_{17}$, gate circuit $C_{18}$, 2nd clock generating circuit $C_{19}$ and column decoder $C_{21}$ correspond to the semiconductor circuit C13 of FIG. 5 and are activated by the internal power source voltage Vint3 from the voltage dropping circuit A3. In the same way, the data input buffer $C_{23}$ and the data output buffer $C_{24}$ correspond to the semiconductor circuit C14 and are activated by the internal power source voltage Vint4 from the voltage dropping circuit A4, and the write clock generating circuit $C_{20}$ corresponds to the semiconductor circuit C15 and is activated by the internal power source voltage Vint5 from the voltage dropping circuit A5.

Generally, in a DRAM, the operating current of a memory cell array inclusive of the sense amplifier is very high, and therefore, during the actuation of the memory cell array, the current flowing through the voltage dropping circuit A1n is increased and an instantaneous voltage drop of the internal power source voltage Vint1 occurs. Since, however, in this embodiment the internal power source voltage Vint1 is independent of the internal power source voltages Vint2 through Vint5 of other semiconductor circuits $C_{12}$ through $C_{15}$, the voltage drops of other internal power source voltages Vint2 through Vint5 can be suppressed even if the power drop occurs in a single internal power source voltage Vint1.

Figure 7:
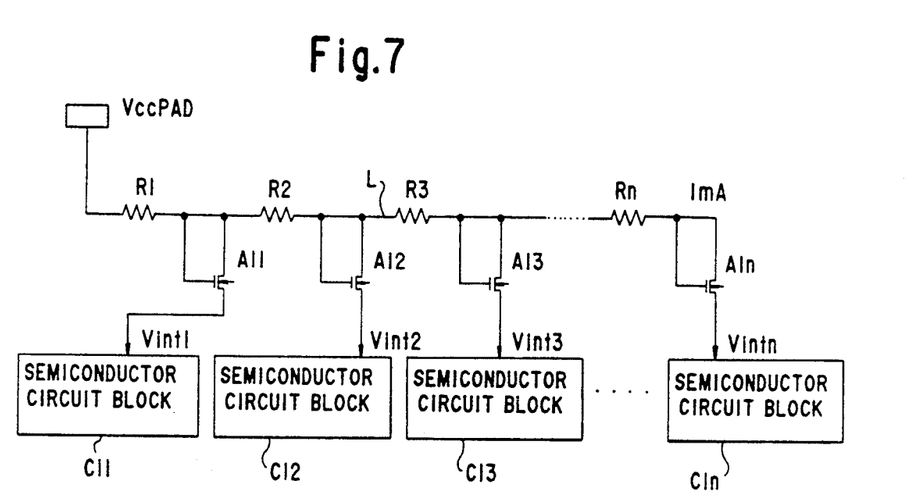
FIG. 7 is a circuit diagram showing the circuit structure of a first embodiment of the voltage dropping circuit of FIG. 5.
Figure 8:
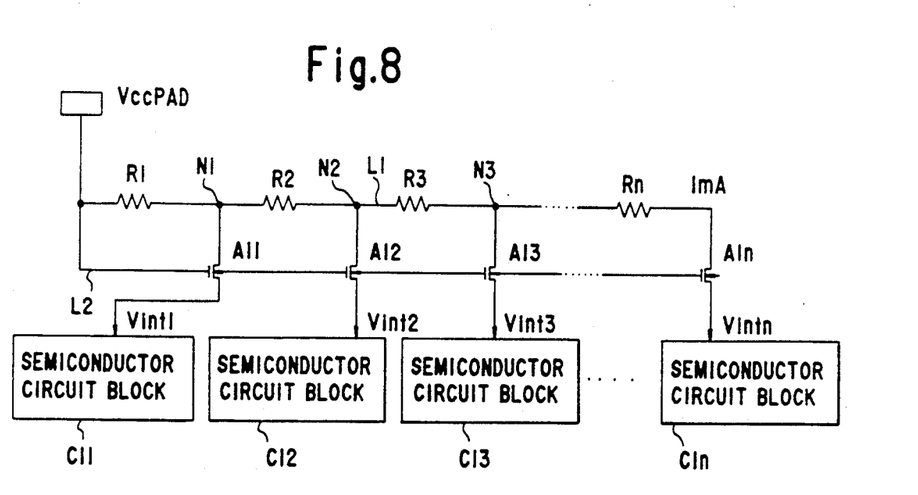
FIG. 8 is a circuit diagram showing the circuit structure of a second embodiment of the voltage dropping circuit of FIG. 5.
Figure 9:
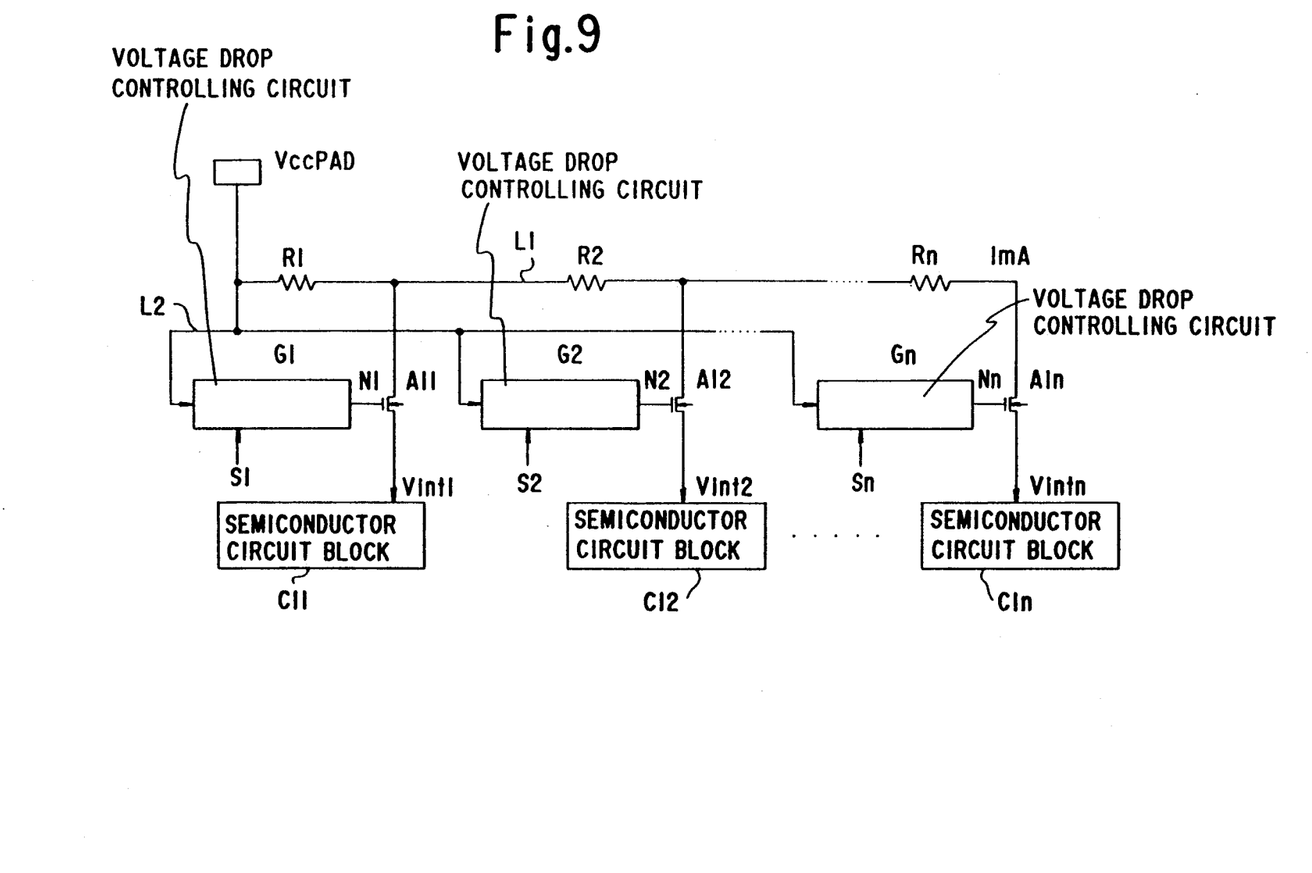
FIG. 9 is a circuit diagram showing the circuit structure of a third embodiment of the voltage dropping circuit of FIG. 5.

FIG. 7 through FIG. 9 are diagrams showing the structures of other embodiments of semiconductor integrated circuits related to the present invention.

FIG. 7 indicates an example of the structure, using respective MOS transistors, of the voltage dropping means A11 through A1n installed at each of a plurality of semiconductor circuit blocks C11 through C1n. In this embodiment, the drain of each MOS transistor is connected to the external power source terminal VccPAD via a common line L, and further, the gate of each MOS transistor is also connected to the external power source terminal VccPAD via the common line L. It is noted that the resistances R1 through Rn in the common line L represent the wiring resistance between the power source terminal VccPAD and the respective MOS transistors. In this embodiment, each of the internal power source voltages Vint2 through Vintn is lowered by the channel resistance of the MOS transistor to the power source voltage Vcc.

FIG. 8 illustrates another example of the structure of, using MOS transistors, wherein the voltage dropping means A11 through A1n are installed at each of a plurality of semiconductor circuit blocks C11 through C1n, and the same reference symbols are used for the same component parts as those in FIG. 7. In this embodiment, the source of each MOS transistor is connected to the external power source terminal VccPAD via the 1st common line L1, and the gate of each MOS transistor is connected to the external power source terminal VccPAD via the 2nd common line L2. It is noted that the resistance R1 through Rn in the 1st common line L1 represent the wiring resistance between the power source terminal VccPAD and the respective MOS transistors.

The following effect can be obtained in accordance with the structure as shown in FIG. 8. That is, assuming a supply of the power source from a single external power source terminal VccPAD to several semiconductor circuits on the chip, since this layout is a two dimensional plane arrangement as shown in FIG. 2, the wiring lengths between a single power source terminal VccPAD and the respective semiconductor circuits differ from each other, and thus give different wiring resistances. This situation is typically shown by the resistances R1 through Rn in FIG. 8.

If the current of ImA flows to the final end C1n of the 1st common line L1, the potentials $VN_1, VN_2, \ldots VN_n$ of respective nodes N1 . . . Nn in the 1st common line L1 can be expressed by each of the following formulas:

$$VN_1 = Vcc - V_{R1},$$
$$VN_2 = Vcc - (V_{R1} + V_{R2}),$$
$$\vdots$$
$$VN_n = Vcc - (V_{R1} + V_{R2} + \ldots V_{Rn}).$$

Where,
Vcc: External power source,
$V_{R1}$: Voltage drop portion by R1 (I, R1),
$V_{R2}$: Voltage drop portion by R2 (I, R2),
$\vdots$
$V_{Rn}$: Voltage drop portion by Rn (I, Rn).

These voltage drop portions are $V_{R1}, V_{R2}, \ldots V_{Rn}$ are given as the multiplied values of the current I mA and the resistance R1 (or R2 . . . Rn), and therefore, if a large current (I mA) flows into a single semiconductor circuit (C1n), the other semi-conductor circuits C11, C12 . . . are subjected to the influence of the voltage drop portions $V_{R1}, V_{R2} \ldots$ etc.

In this embodiment, however, because the gates of a plurality of MOS transistors to be connected to each of the nodes N1 . . . Nn are connected to the external power source terminal VccPAD by the 2nd common line L2, which is a dedicated wiring other than the 1st common line L1, (i) the gate potential of each MOS transistor can be made approximately the potential of external power source potential Vcc, since the gate current of MOS transistor is very small (i.e., almost zero); and therefore, (ii) the internal power source voltage Vint1 . . . Vintn supplied to the semiconductor circuits C11 . . . C1n can be made the constant potentials which have been lowered by the threshold value $V_{th}$ portion of MOS transistor from the external power source potential Vcc, even if a voltage drop occurs at the nodes N1 . . . Nn; and (iii) the influence of a voltage drop by the wiring resistances R1 . . . Rn in the 1st common line L1 can be effectively avoided.

Figure 11:
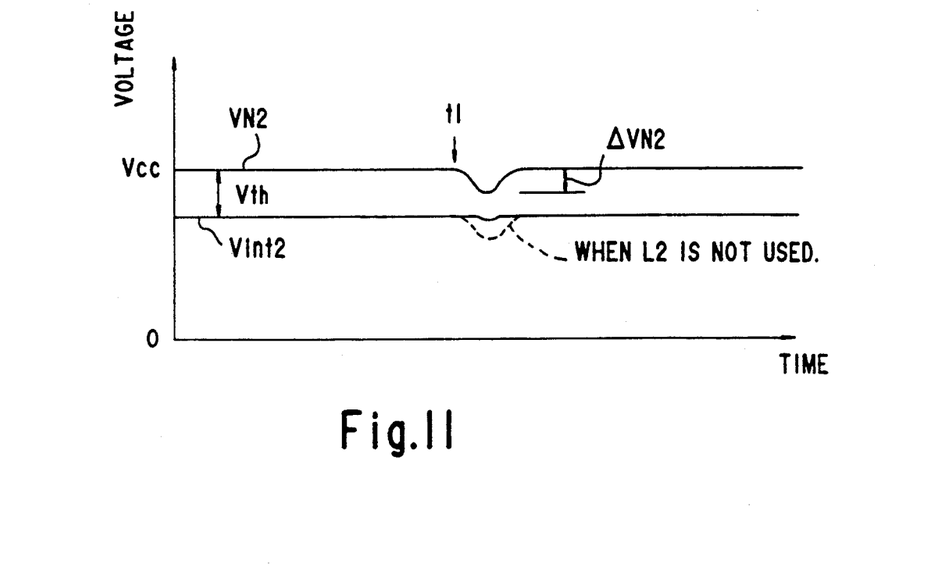
FIG. 11 is a time-voltage characteristic graph explaining the stability of an internal power source voltage of a semiconductor integrated circuit according to this invention.

In other words, the internal power source voltage Vint2, for example, of the semiconductor circuit C12 given at the voltage lower by the threshold value $V_{th}$ portion of MOS transistor from the external power source potential Vcc as shown in FIG. 11 is not subjected to the influence of the aforementioned potential difference $\Delta$ VN2, or even if subjected, such an influence is slight, and can maintain an almost constant potential (Vcc $- V_{th}$) because the gate potential of MOS transistor is maintained approximately at the external power source potential Vcc by the 2nd common line L2, which is an exclusive-use wiring, even if the potential VN2 of node N2 is lowered by the potential difference VN2 at the time t1. It is noted that the dotted line in FIG. 11 is the voltage waveform of FIG. 7 connected to the same node with the gate drain of MOS transistor used in common, and the internal power source voltage Vint2 is greatly fluctuated by the voltage fluctuation of the node.

Figure 10:
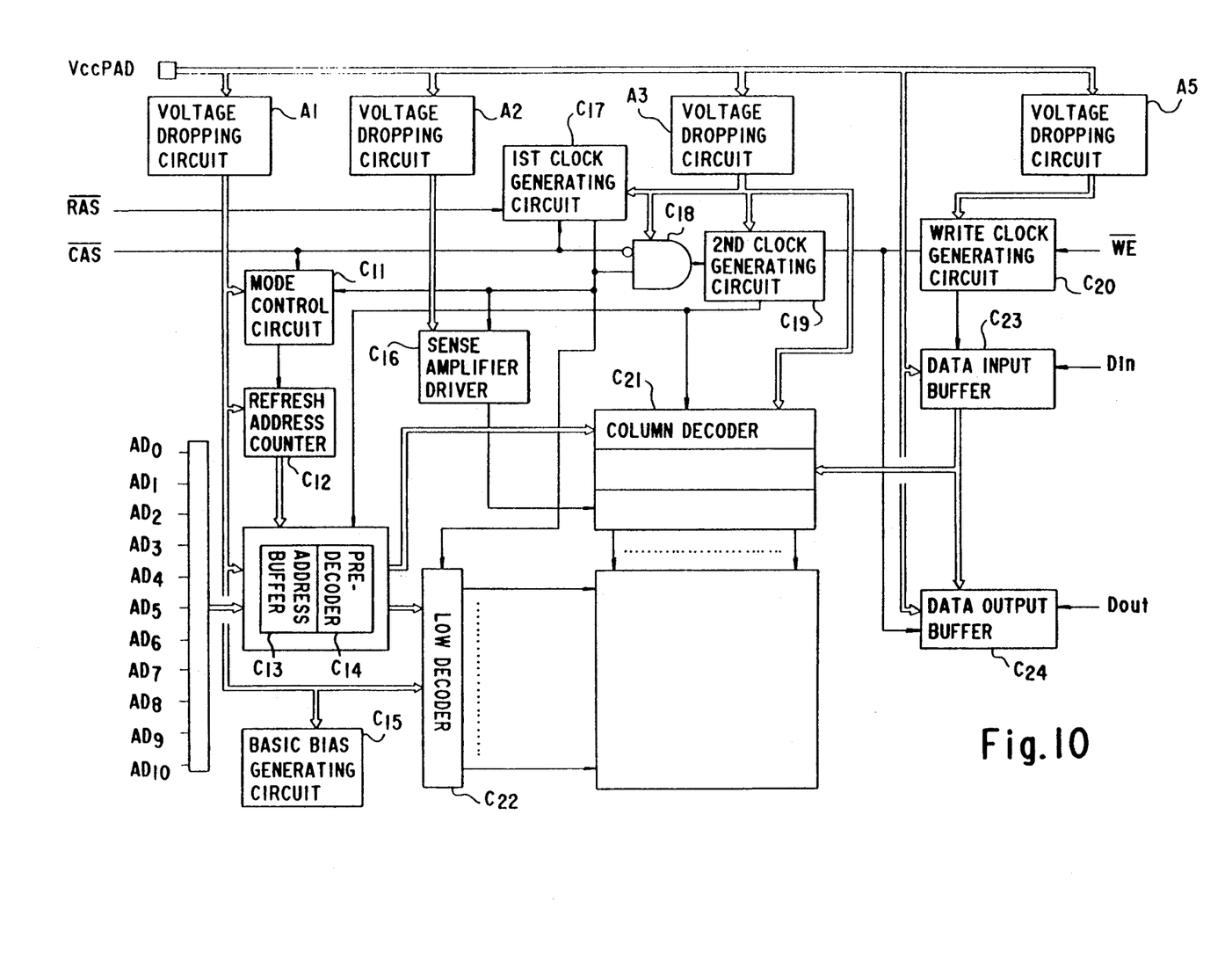
FIG. 10 is a block circuit diagram showing a transformed embodiment of a block circuit diagram of FIG. 6.

FIG. 9 shows a transformed pattern of the embodiment given in FIG. 8; and identical reference symbols are used for the same structural portions as those in FIG. 8. In this embodiment the gate of each MOS transistor in the structure of the voltage dropping circuits A11 through A1n is connected to the 2nd common line L2 via the voltage drop controlling circuits G1, G2 . . . Gn. In this embodiment, if any of the voltage drop controlling circuits G1 . . . Gn (for example, G2) is activated by the individual selection signals S1 . . . Sn, the 2nd common line L2 is connected to the gate of MOS transistor A12 via the voltage drop controlling circuit G2 under activation, and thus the gate potential of the MOS transistor can be maintained at approximately the power source voltage Vcc, and thus an effect similar to that of the embodiment shown in FIG. 8 is obtained. Furthermore, since in this embodiment, the power source supply to the respective semiconductor circuit blocks C11 through C1n can be switched ON and OFF by the individual selection signals S1 through Sn, it is preferably applied to the semiconductor integrated circuit in which an attempt is made to obtain a lower power consumption by dividing, for example, the memory cell array into a plurality of blocks and switching off the power source supply in non-operating blocks FIG. 10 shows the transformed embodiment of a concrete example of the semiconductor circuit blocks C11 through C1n in accordance with the present invention, where the semiconductor integrated circuit shown in FIG. 6 is a DRAM, and is an example of the case wherein the voltage of the external power source does not fall, because the characteristics of the device are to be applied, as is, to the data input buffer $C_{23}$ and the data output buffer $C_{24}$. Since the voltage dropping circuits are respectively installed at each of the semiconductor circuits in the semiconductor integrated circuit of this invention, a transformed embodiment considering the characteristics of device is thus available. Further, although the internal power source voltage of the sense amplifier driver $C_{16}$ is formed by the voltage dropping circuit A2 in the circuit in FIG. 10, this voltage dropping circuit A2 need not to be installed at the sense amplifier driver which per se has an external power source voltage dropping action.

Figure 12:
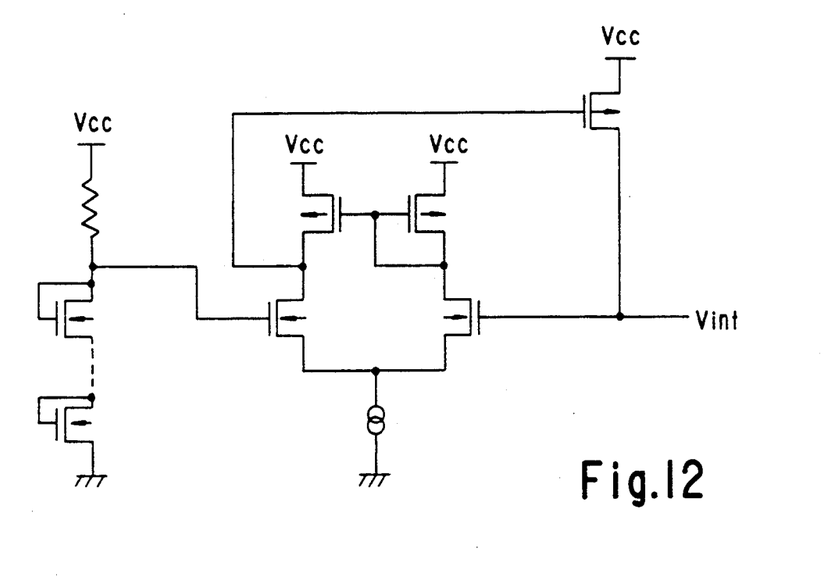
FIG. 12 is a circuit diagram of another embodiment of the voltage dropping circuit; and, FIG. 13 through FIG. 19 are circuit diagrams showing concrete circuit structural examples of the voltage drop controlling circuit of FIG. 9.

FIG. 12 shows a circuit diagram of another embodiment of the voltage dropping circuit, as used in the embodiments explained above, and is an example of a voltage dropping circuit using a plurality of MOS transistors.

Figure 13:
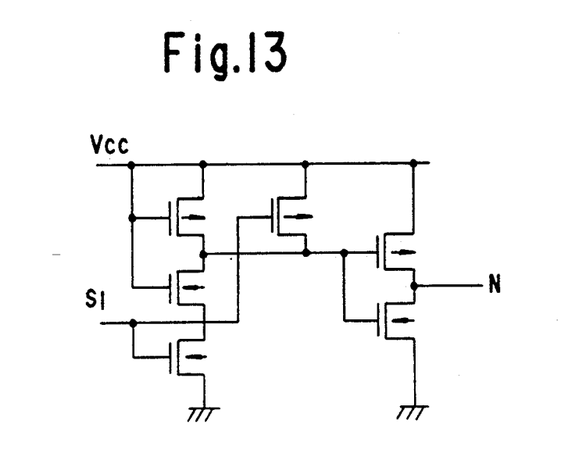
Figure 14:
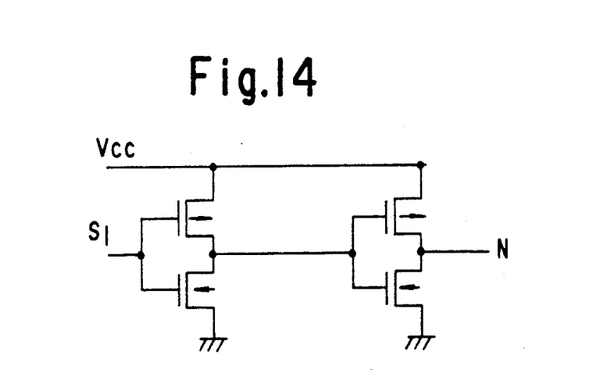
Figure 15:
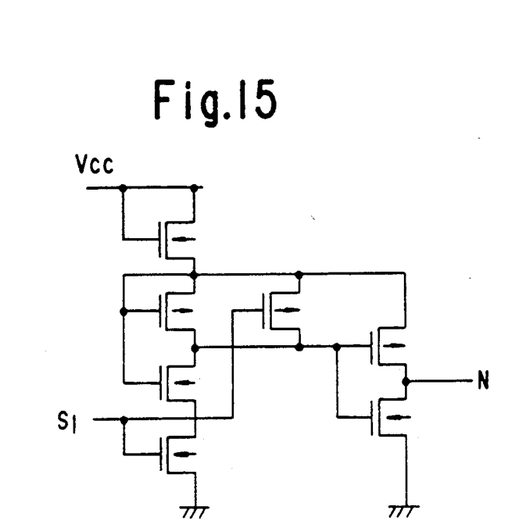
Figure 16:
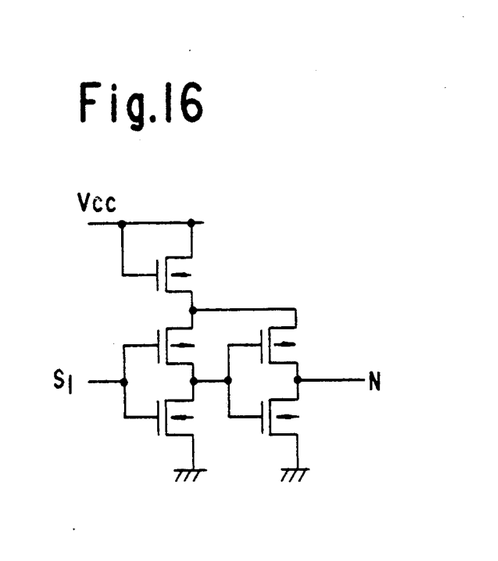
Figure 17:
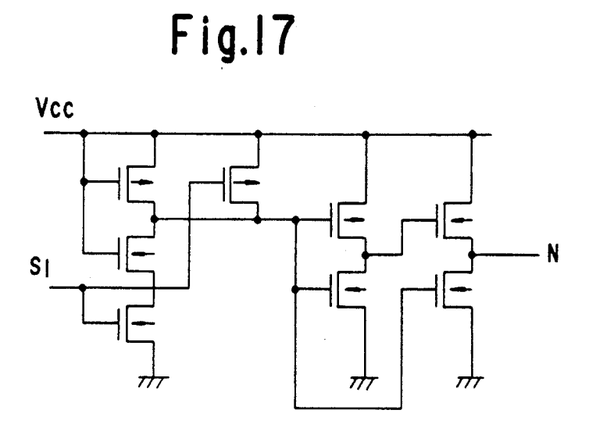
Figure 18:
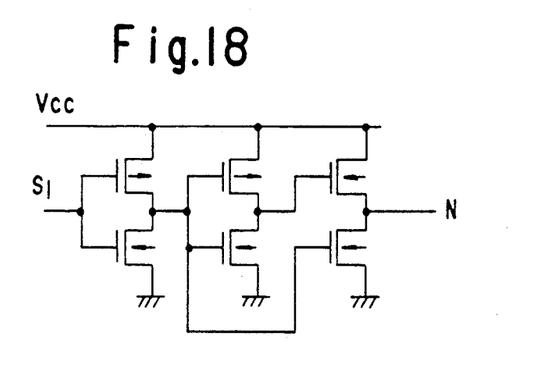

FIG. 13 and FIG. 14 are circuit diagrams showing the concrete circuit structural examples of the voltage drop controlling circuits of FIG. 9, and are examples of cases where the voltage drop potential is the external power source voltage Vcc and the threshold value voltage is $V_{th}$. Therefore, since the threshold value voltage is about 1 V when the external power source voltage Vcc is 5 V, the internal power source voltage in the semiconductor integrated circuit using the circuit in this embodiment is about 4 V.

FIG. 15 through FIG. 18 are circuit diagrams showing other concrete circuit structural examples of the voltage drop controlling circuits of FIG. 9, and are examples of cases in which the voltage drop potential is the external power source voltage Vcc and the threshold value voltage is 2 Vth. Therefore, since the threshold value voltage is about 1 V when the external power source voltage Vcc is 5 V, the internal power source voltage in the semiconductor integrated circuit using the circuit of this embodiment is about 3 V.

Figure 19:
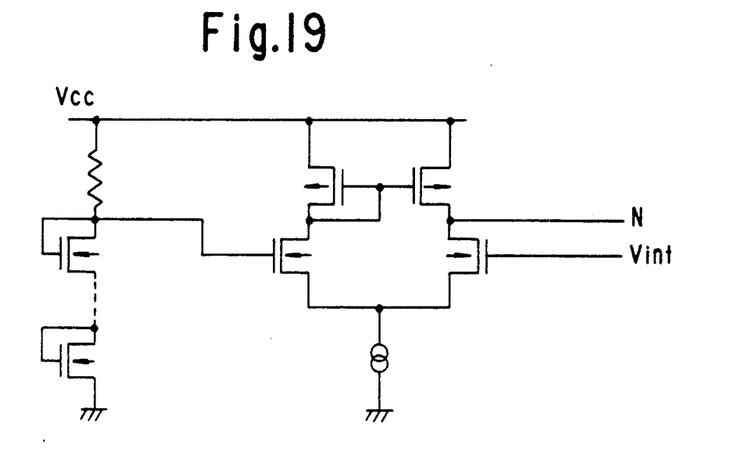

FIG. 19 is a circuit diagram showing another concrete circuit structural example of the voltage drop controlling circuit of FIG. 9, and shows a circuit structure whereby the voltage drop potential can be optionally set up.

While the invention has been particularly shown and described in reference to preferred embodiments thereof, it will be understood by those skilled in the art that changes in form and details may be made therein without departing from the spirit and scope of the invention.

We claim:

1. A semiconductor integrated circuit for receiving an external power source voltage from outside of a semiconductor chip, comprising:

an external power source terminal (VccPAD) for supplying said external power source voltage as an internal power source voltage into said semiconductor chip;

a voltage dropping means (A) within said semiconductor chip for dropping said external power source voltage, wherein said voltage dropping means comprises a plurality of voltage dropping means (A1 through An) for connecting said external power source terminal (VccPAD) within said semiconductor chip and for changing said external power source voltage to a desired internal power source voltage; and a plurality of semiconductor circuit blocks (C11 through C1n) within said semiconductor chip respectively coupled to said voltage dropping means (A1 through An), wherein the voltage dropping means (A1 through An) for each of said semiconductor circuit blocks (C11 through C1n) includes at least 1 MOS transistor (A11 through A1n), and wherein drains of said respective MOS transistors (A11 through A1n) are connected in common through a first common line for connection to said external power source terminal (VccPAD), and gates of respective MOS transistors (A11 through A1n) are also connected to said first common line.

2. The semiconductor integrated circuit as set forth in claim 1, wherein gates of respective MOS transistors (A11 through A1n) are connected in common through a second common line (L2) for connection to said first common line (L1).

3. The semiconductor integrated circuit as set forth in claim 2, further comprising voltage drop controlling circuits (G1 through Gn) for independently switching on/off a power source supply to the respective semiconductor circuit blocks (C11 through C1n) by using individual selection signals (S1 through Sn) between the gates of said respective MOS transistors (A11 through A1n) and the second common line.

4. The semiconductor integrated circuit as set forth in claim 3, wherein the voltage dropping means (A1 through An) for each of said respective semiconductor circuit blocks (C11 through C1n) include at least one MOS transistor (A11 through A1n).

5. The semiconductor integrated circuit as set forth in claim 4, wherein the external power source voltage is dropped by the threshold level of MOS transistors by said respective voltage drop controlling circuits (G1 through Gn) and the voltage dropping means (A1 through An).

6. The semiconductor integrated circuit as set forth in claim 4, wherein the external power source voltage is dropped by twice the threshold level of the MOS transistors by said respective voltage drop controlling circuits (G1 through Gn) and the voltage dropping means (A1 through An).

7. The semiconductor integrated circuit as set forth in claim 4, wherein the external power source voltage is dropped by an optional voltage by said respective voltage drop controlling circuits (G1 through Gn) and the voltage dropping means (A1 through An).

8. The semiconductor integrated circuit as set forth in claim 4, wherein all of the voltage drop values of an external power source for respective semiconductor circuit blocks (C11 through C1n) are not identical to each other, due to the presence of said respective voltage drop controlling circuits (G1 through Gn) and the voltage dropping means (A1 through An).

* * * * *